July 7, 1964 V. H. LAUGHTER 3,140,348
TRANSISTOR AMPLIFIER
Filed March 21, 1961
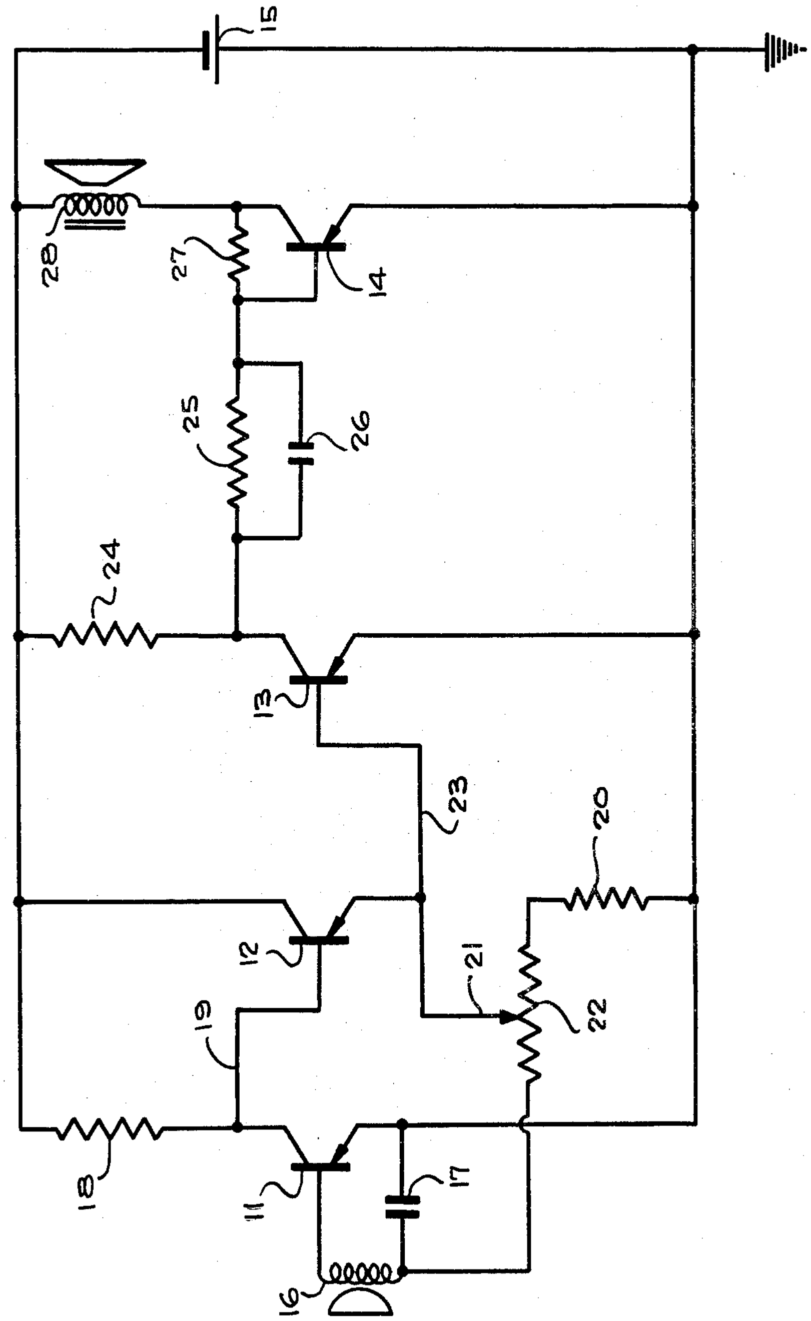
INVENTOR.
VICTOR H. LAUGHTER
BY Hurvitz and Rose
ATTORNEYS United States Patent Office 3,140,348
Patented July 7, 1964

3,140,348

TRANSISTOR AMPLIFIER

Victor H. Laughter, 1650 Peabody Ave., Memphis, Tenn., assignor of one-half to Paul S. Jones, Memphis, Tenn.

Filed Mar. 21, 1961, Ser. No. 97,271
10 Claims. (Cl. 179—1)

The present invention relates generally to amplifiers and more particularly to audio frequency transistorized amplifiers suitable for use with hearing aids, particularly of the type utilized on eye glasses or in behind the ear containers.

It is necessary for hearing aids contained in eye glasses or behind the ear containers to be of minimum size and consequently consist of a very small number of parts. Also, temperature stabilization of hearing aid amplifiers is necessary to maintain gain constant thereby preventing undesirable signal fluctuations. Previous hearing aid amplifiers have generally employed a great many components and have not provided sufficient stabilization. Stabilization should be greatest when the alternating current output signal is minimum because fluctuations are most easily noticeable under this condition. As the audio output signal increases, it is not necessary to provide as much stabilization. Too much stabilization is even undesirable, to a certain extent, when large amplitude signals are desired because of the drop in gain resulting from great amounts of direct current feedback.

Accordingly, it is an object of the present invention to provide an alternating current amplifier with improved stabilization properties.

Another object is to provide a transistorized audio amplifier in which output signal and stabilization are varied in opposite senses, i.e. the amplitude of the output signal is increased as feedback is decreased and vice versa.

An additional object is to provide a new and improved temperature stabilized, transistorized, audio amplifier especially adapted for hearing aid use wherein the amplifier contains a minimum of parts, is inexpensive to manufacture and is highly reliable.

Basically, the present invention contains a grounded emitter first stage direct current coupled to an emitter follower stage. The emitter of the second stage is connected to the slider of a potentiometer, one side of which is connected to a shunting alternating current by-pass capacitor and to the base of the first stage. Thus, a negative feedback circuit is provided for stabilizing only direct current operating conditions in the first stage. The amount of direct current feedback and the amplitude of the alternating current output signals are varied in opposite senses by variation of the potentiometer arm. An additional grounded emitter stage, physically located in proximity to the first stage is temperature stabilized by the direct current voltage at the emitter of the second stage to which it is direct current coupled. The output signal of the third stage is fed to a power amplifier which supplies a suitable speaker with the audio signal.

Consequently, a further object of the present invention is to provide a transistorized amplifier having at least three stages wherein temperature stabilization of at least said stages is achieved.

The above and still further objects, features and advantages of the present invention will become apparent upon consideration of the following detailed description of one specific embodiment thereof, especially when taken in conjunction with the accompanying drawing, wherein the single figure is a schematic illustration of a preferred embodiment of the present invention.

The amplifier illustrated on the figure comprises four cascaded P-N-P transistors 11, 12, 13 and 14, each having its collector and emitter connected between battery

15 so the collector of each transistor is negatively biased with respect to the emitter. It is preferable that each transistor be of the subminiature type and have an average beta value (ratio of base to collector currents) of 100.

One end of standard hearing aid microphone coil 16 is connected to supply an audio frequency signal to the base or input electrode of grounded emitter transistor stage 11. The other end of coil 16 is connected through de-coupling capacitor 17 to the emitter of transistor 11, directly connected to the positive terminal of battery 15, which is grounded. Load resistor 18 is connected between the collector or output electrode of transistor 11 and the negative terminal of battery 15. The collector or output voltage of transistor 11 is direct current coupled to the base or input electrode of transistor 12 by lead 19 connected therebetween.

Transistor 12 is arranged in an emitter follower circuit wherein slider 21 of volume control potentiometer 22 is directly connected to the emitter or output electrode of transistor 12. Direct current limiting resistor 20 is connected between the positive side of battery 15 and one side of potentiometer 22, the other side of which is connected to the junction between coil 16 and by-pass capacitor 17. In this manner, negative feedback for only direct current in transistor 11 is achieved by means of transistor 12 and its associated circuitry. The value of capacitor 17 is chosen so it effectively shunts substantially all of the audio signal thereby preventing adverse signal feedback effects.

Direct current bias stabilization of transistor 11 is affected by means of the negative or degenerative feedback circuit in the following manner. As the temperature of the unit increases, collector current of transistor 11 is increased thus increasing collector voltage with respect to ground, i.e. making the collector voltage less negative. Thereby, the net negative base current of transistor 12 is decreased, resulting in a decrease of its collector and emitter current. The decrease in emitter current of transistor 12 causes a decrease in the net negative current supplied through potentiometer 22 and coil 16 to the base of transistor 11. In consequence, the collector current of transistor 11 decreases, thus compensating for its increased collector current due to higher temperature.

The output signal of transistor 12 is direct current coupled to the input electrode of transistor 13 by lead 23, connected between slider 21 and the base of common emitter transistor 13. The collector of transistor 13 is connected through load resistor 24 to the negative side of battery 15 while its emitter is connected directly to the positive terminal of the battery. Direct current conditions of transistor 13 are established by the direct current bias at the emitter of transistor 12. Since transistors 11 and 13 are located in physically adjacent regions, they both have the same tendency to take increased collector current as temperature rises.

As previously described, collector current in transistor 12 decreases with increased collector current in transistor 11, causing the emitter voltage of transistor 12 and the base voltage of transistor 13 to increase with respect to ground. Consequently, the tendency of collector current in transistor 13 to increase with increased temperature is neutralized by the operation of transistors 11 and 12. The alternating current signal supplied to high gain transistor stage 13 is controlled by the position of slider 21 so its input signal is minimum when the slider is in the extreme left position, as shown on the drawing. This is because capacitor 17 serves to shunt substantially all of the audio signal and the value of resistor 20 is chosen so the alternating current through it is always less than through potentiometer 22.

At the time the audio signal supplied to grounded emitter stage 13 is a minimum, the direct current feedback signal to the base of transistor 11 is a maximum, because of the relatively low direct current impedance between slider 21 and the base of transistor 11. As slider 21 is moved to the right, direct current feedback decreases and alternating current output signal increases. Thus, the absolute magnitudes of the alternating current output signal and the direct current feedback signal change in opposite senses by movement of the variable impedance element constituting potentiometer 22. It is desirable to have maximum direct current feedback with minimum alternating current output signal so the circuit is properly stabilized. Unstabilization introduces possible alternating current fluctuations that may adversely affect the low signal level. With greater alternating current signal output these fluctuations are not noticed as easily, consequently, are not as detrimental. If a large magnitude alternating current output signal is necessary, slider 21 is positioned adjacent the right side of potentiometer 21, thus reducing direct current feedback and increasing the gain of the system. It has been found capacitor 17 improves tone characteristics of the audio output signal when slider 21 is positioned adjacent the left side of potentiometer 22.

The collector or output signal of transistor 13 is coupled through the parallel combination of resistor 25 and capacitor 26 to the base of grounded emitter, power output transistor stage 14. The value of capacitor 26 is chosen to provide a substantially short circuit for the audio signal currents, thereby suppling a large amplitude signal to the input terminal of transistor 14 while resistor 25 is designed to limit the direct current base current to provide proper biasing. Direct current biasing of transistor 14 is established by feedback resistor 27, connected between its collector and base, as well as by the parallel resistance-capacitance circuit and resistor 24. Coil 28 of a conventional hearing aid speaker is connected between the collector of transistor 14 and the negative terminal of battery 15. The output circuitry associated with transistor 14 is well known in the art and a description of its operation is not deemed necessary.

The audio amplifier circuit disclosed herein provides great direct current stabilization, high signal gain, good tone characteristics over a wide signal amplitude range and yet employs a minimum of small parts thus promoting miniaturization essential in hearing aids and other devices.

While I have described and illustrated one specific embodiment of my invention, it will be clear that variations of the details of construction which are specifically illustrated and described may be resorted to without departing from the true spirit and scope of the invention as defined in the appended claims. For instance, resistor 20 may be incorporated in potentiometer 22 by providing an appropriate stop therein or the emitters of transistors 11 and 13 may be connected to ground through suitable biasing resistors, if necessary or desirable.

While I have described and illustrated one specific embodiment of my invention, it will be clear that variations of the details of construction which are specifically illustrated and described may be resorted to without departing from the true sprit and scope of the invention as defined in the appended claims.

What I claim is:

1. A transistor amplifier comprising a first transistor stage for amplifying an audio signal, means for connecting the base of said first transistor to a means for coupling an audio signal thereto, means for connecting the emitter of said first stage to ground, an emitter follower transistor stage direct current coupled to the collector of said first transistor stage, a negative feedback circuit connected between said first stage and said emitter follower stage for direct currents only, said feedback circuit including variable impedance means for changing the absolute magnitude of the audio output signal of said emitter follower stage and the absolute magnitude of the direct current feedback signal supplied to the base of said first stage in opposite senses.

2. The circuit of claim 1 wherein said feedback circuit includes a potentiometer, a capacitor connected between one end of said potentiometer and ground, a resistor connected between the other end of said potentiometer and ground, the slider of said potentiometer connected to the emitter of said emitter follower stage and said one end of said potentiometer connected to the base of said first transistor stage.

3. The amplifier of claim 1 including a further transistor amplifier stage, the base of said further transistor stage being direct current coupled to the emitter of said emitter follower stage.

4. The amplifier of claim 3 further comprising a power output stage including a speaker coil.

5. A transistor amplifier comprising a first transistor, means for connecting the base of said first transistor to a means for supplying signal thereto, means for connecting the emitter of said first transistor to ground, an emitter follower transistor stage, means for direct current coupling the collector of said first transistor to the base of said emitter follower transistor stage, a negative feedback circuit connected between the emitter of said emitter follower transistor stage and the base of said first transistor, a further transistor having the base thereof direct current coupled to the emitter of said emitter follower stage, and a load in the collector emitter path of said further transistor.

6. A transistor amplifier comprising a first transistor for amplifying an alternating current signal and having input and output electrodes, a second transistor having input and output electrodes, the input electrode of said second transistor direct current coupled to the output electrode of said first transistor, a negative feedback circuit between the output electrode of said second transistor and the input electrode of said first transistor for direct currents only, said feedback circuit including variable impedance means for changing the absolute magnitude of the alternating current output signal of said second transistor and the absolute magnitude of the direct current feedback signal to the input electrode of said first transistor in opposite senses.

7. The amplifier of claim 6 including a third transistor for amplifying the alternating current output signal of said second transistor, said third transistor having an input electrode direct current coupled to the output electrode of said second transistor.

8. An audio frequency transistor amplifier comprising a first grounded emitter transistor stage, an emitter follower transistor stage having the base thereof direct current coupled to the collector of said first grounded emitter stage, a microphone coil having one end connected to the base of said first grounded emitter stage, an audio frequency by-pass capacitor connected between said microphone coil and ground, a potentiometer having one end connected to the other end of said microphone coil, a resistor connected between the other end of said potentiometer and ground, the slider of said potentiometer being connected to the emitter of said emitter follower stage, a second grounded emitter transistor stage having the base electrode thereof direct current coupled to said slider, and a transistor power amplifier stage having the base thereof connected to the collector of said second grounded emitter stage, said power stage including a speaker coil.

9. The amplifier of claim 5 wherein said negative feedback circuit is for direct current only.

10. The amplifier of claim 1 wherein said impedance is variable at will.

References Cited in the file of this patent

UNITED STATES PATENTS

| | | |
|---|---|---|
| 2,860,195 | Stanley | Nov. 11, 1958 |
| 2,954,530 | Haskell | Sept. 27, 1960 |
| 3,001,144 | Dandl | Sept. 19, 1961 |
| 3,004,157 | Freedman | Oct. 10, 1961 |